US008610518B1

(12) United States Patent
Solal et al.

(10) Patent No.: US 8,610,518 B1
(45) Date of Patent: Dec. 17, 2013

(54) ELASTIC GUIDED WAVE COUPLING RESONATOR FILTER AND ASSOCIATED MANUFACTURING

(75) Inventors: Marc Solal, Longwood, FL (US); Christophe Zinck, Grenoble (FR)

(73) Assignee: TriQuint Semiconductor, Inc., Hillsboro, OR (US)

( * ) Notice: Subject to any disclaimer, the term of this patent is extended or adjusted under 35 U.S.C. 154(b) by 306 days.

(21) Appl. No.: 13/110,518

(22) Filed: May 18, 2011

(51) Int. Cl.
H03H 9/64 (2006.01)
(52) U.S. Cl.
USPC .......... 333/193; 333/195; 310/313 B
(58) Field of Classification Search
USPC .............. 333/193–196; 310/313 B
See application file for complete search history.

(56) References Cited

U.S. PATENT DOCUMENTS

| 5,790,000 | A * | 8/1998 | Dai et al. ............... 333/193 |
| 6,617,752 | B2 | 9/2003 | Nakao et al. |
| 6,762,534 | B2 | 7/2004 | Martin et al. |
| 6,781,485 | B2 | 8/2004 | Takamine et al. |
| 6,859,117 | B2 | 2/2005 | Martin et al. |
| 6,940,368 | B2 | 9/2005 | Plessky et al. |
| 7,262,676 | B2 * | 8/2007 | Ruile et al. ............. 333/193 |
| 7,310,027 | B2 | 12/2007 | Kando |
| 7,623,009 | B2 | 11/2009 | Kando et al. |
| 8,283,835 | B2 * | 10/2012 | Metzger et al. ........... 310/313 A |
| 2008/0094150 | A1 | 4/2008 | Meister et al. |
| 2008/0297277 | A1 * | 12/2008 | Meister et al. ........... 333/189 |

OTHER PUBLICATIONS

Keishin Koh, Takanori Yamazaki, Yuji Terao, Kohji Hohkawa; "Study on SAW Devices Having Face to Face Aligned Packaged Structure"; 2008 IEEE International Ultrasonics Symposium Proceedings; pp. 1596-1599.

Liudi Jiang, G. Pandraud, P.J. French, S.M. Spearing, M. Kraft; "A Novel Method for Nanoprecision Alignment in Wafer Bonding Applications"; School of Engineering Sciences, University of Southampton, UK; Published Jun. 26, 2007.

Hiroyuki Okitsu, Keishin Koh, Kohji Hohkawa; "A Basic Study on Mode Coupling SAW Device with Face to Face Bonding"; Symposium on Ultrasonic Electronics, vol. 30; Nov. 18-19, 2009; pp. 279-280.

* cited by examiner

*Primary Examiner* — Barbara Summons
(74) *Attorney, Agent, or Firm* — Schwabe, Williamson & Wyatt, P.C.

(57) ABSTRACT

An elastic guided acoustic wave coupling resonator filter includes a dielectric layer interposed between piezoelectric substrates, with interdigital transducers on each substrate generally positioned at an interface between the substrates and the dielectric layer. The interdigital transducers on one substrate are aligned with the transducers on the opposing substrate and include cascaded filter tracks. The cascaded orientation between the two filter tracks includes either a differential connection or a balanced connection. As a result, the interdigital transducers are electrically isolated yet acoustically coupled to each other.

37 Claims, 9 Drawing Sheets

ELASTIC GUIDED WAVE COUPLING RESONATOR FILTER AND ASSOCIATED MANUFACTURING

FIELD OF THE INVENTION

The present invention generally relates to acoustic wave devices, and more particularly to elastic guided wave filters.

BACKGROUND OF THE INVENTION

Elastic wave devices are widely used for manufacturing resonators, filters, duplexers and sensors operating at RF frequencies. Examples of typical elastic wave devices include surface acoustic wave (SAW) devices using the propagation of elastic waves at the surface of a piezoelectric surface, and bulk acoustic wave (BAW) devices using the propagation and resonances of elastic waves in a thickness of thin films. Packaging is an important part of the cost of these devices. To reduce costs, wafer level packaging technology where the package is manufactured collectively at the wafer level is typically employed.

Another example is disclosed in U.S. Pat. No. 7,310,027 to Kando for a Boundary Acoustic Wave Filter which employs a boundary acoustic wave or interface wave and uses the propagation of such waves at the interface of two materials. In this case, the transducers used to generate and detect the waves are interdigital transducers (IDT) similar to the transducers used for SAW devices. The main difference between this device and other elastic wave devices is that the IDTs are placed at the interface of two materials.

There is a need to make filters capable of working with unbalanced inputs and balanced outputs or balanced inputs and unbalanced outputs, as desired. Typically, one way to achieve this with SAW or BAW devices is to use a coupled resonator filter (CRF). These filters generally include several IDTs between reflective gratings. Such CRFs are also used to design single-ended filters, since they usually provide a desirable far-out rejection.

However, a problem associated with the CRF is its power handling. The number of electrodes of the transducer (IDT) has to be small enough to provide a wide bandwidth. Consequently, the energy density is large and the power handling is poor. In contrast for ladder filters, the size of the transducer is much larger resulting in a more desirable power handling.

By way of further example regarding techniques typically used by those of skill in the art, reference is made to H. Okitsu et al. for "A basic study of mode coupling SAW device with face to face bonding", proc. of symposium on ultrasonics electronics, vol. 30(2009), pp 279-280, 18-20 Nov. 2009; K. Koh et al., for "Study of SAW device having face to face aligned package structure", 2008 IEEE Ultrasonics symp. proc., pp 1596-1599; and Meister et al. for "Component That Operates Using Acoustic Waves and Method for Producing Said Component, US Patent Application Publication No. US 2008/94150 A1, the disclosures of which are herein incorporated by reference in their entirety.

Okitsu describes a way to manufacture SAW filters using face to face bonding, wherein two substrates with SAW devices are bonded to form a cavity. The two SAW devices are separated by a gap. One advantage of such a structure and method is that there is no need for a typical wafer package. There is some coupling between the two devices but since there is no material between the two substrates, the coupling is only electrostatic.

Koh discloses a similar device wherein a liquid with an elastic property is used to provide some acoustic coupling between two SAW devices. In both of the Okitsu and Koh references, bonding is done in a region far from the transducer. Acoustic coupling exists through a liquid.

Meister discloses a device using a piezoelectric film between a substrate and electrodes in an IDT on each side of the substrate. In one described embodiment, the acoustic excitation is done along a direction in a plane while the coupling is done through the piezoelectric film. Such an approach makes it difficult to achieve a desirable electro-acoustic coupling for an excitation by the IDT at the surface of a piezoelectric film. As described, the busbars of the transducers face each other through the piezoelectric layer. This is equivalent to having a BAW resonator between the input and the output of the device, and it will result in deterioration of the filter rejection and/or ripple in the passband. Further, the variation of the frequency versus the temperature may be large. A film of silicon oxide may reduce this variation. In addition, to obtain desirable results, the wave has to be guided in the layers. To ensure this, the velocity of the wave in the film has to be smaller than the velocity of the wave in the substrate.

There remains a need for a device and method for reducing package size for an acoustic wave device that provides for a single balanced operation. Desirably, such devices should use relatively large transducers, should have reduced temperature sensitivity, and should obtain low load and/or source impedances. The present invention satisfies such needs.

BRIEF DESCRIPTION OF THE DRAWINGS

For a fuller understanding of the invention, reference is made to the following detailed description taken in connection with the accompanying drawings which illustrate various embodiments of the present invention, in which.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternate embodiments.

Figure 1:
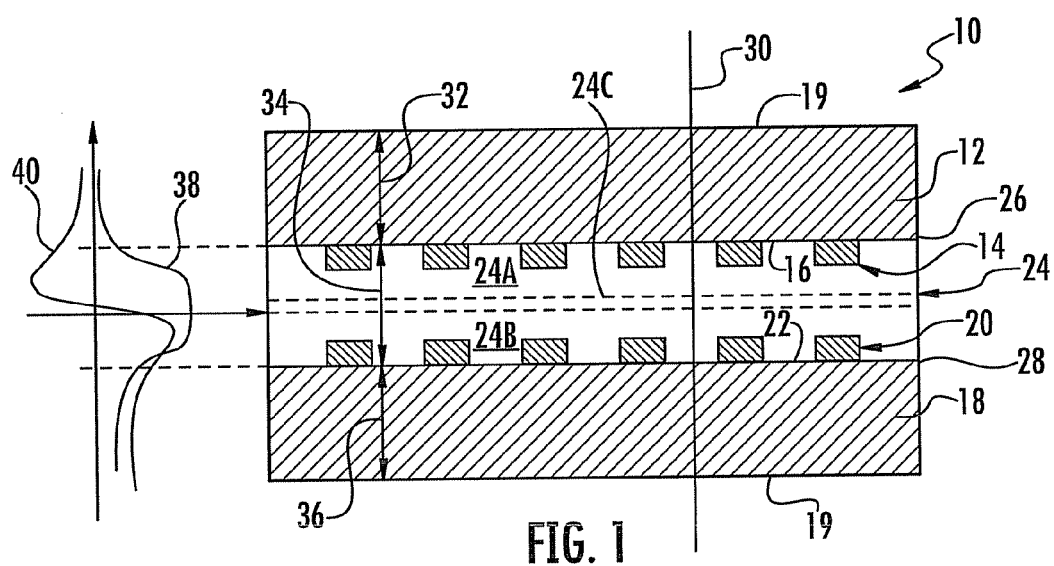
FIG. 1 illustrates an acoustic wave filter device according to one embodiment of the present invention.

FIG. 1 is a diagrammatical cross sectional view of an acoustic wave filter device according to one embodiment of the present invention, wherein dielectric material is present between opposing piezoelectric substrates that include interdigital transducers. In FIG. 1, one embodiment of the invention is herein described as an acoustic wave device 10 comprising a first piezoelectric substrate 12 having a first interdigital transducer 14 on a surface 16 of the first substrate, and a second piezoelectric substrate 18 having a second interdigital transducer 20 on a surface 22 of the second substrate.

A dielectric layer 24 is interposed between the first and second piezoelectric substrates 12, 18, wherein the first and second interdigital transducers 14, 20 (also herein referred to as transducers 14, 20) are positioned on the surfaces 16, 22 at interfaces 26, 28 of the piezoelectric substrates 12, 18 and the dielectric layer 24. As a result of the dielectric layer 24 positioned between the substrates 12, 18, the first and second interdigital transducers 14, 20 are electrically isolated, but acoustically coupled to each other. While illustrated as a single dielectric layer 24, the dielectric layer may comprise multiple dielectric layers 24A, 24B and may include one or more metal layers 24C. The dielectric layer 24 may be formed from a material capable of supporting an acoustic wave, wherein a velocity of the acoustic wave in the dielectric material increases with an increase in temperature of the material.

By way of example regarding the transducers 14, 20, electrodes forming the transducers 14, 20 have an average density larger than a density of aluminum, and generally comprise copper, tungsten, molybdenum gold or platinum. The electrodes comprising copper, by way of example, may have a thickness ranging between h/2p=1% and h/2p=4% (wherein "p" represents a period for electrodes), or a thickness that ranges between h/2p=5% and h/2p=15%.

With regard to the structures herein described by way of example, it is of interest to note that an acoustic wave is guided in the dielectric layer 24 and that the velocity of the acoustic wave propagating in a direction perpendicular to the electrodes of the IDTs 14, 20 is larger in the piezoelectric substrates 12, 18 than in the dielectric layer 24. Further, a product of a center frequency of the acoustic wave being propagated and twice an electrode period for electrodes is lower than bulk acoustic wave velocities in the substrates 12, 18 for a direction of an acoustic wave propagating perpendicular to the electrodes. Such conditions ensure that the waves are evanescent in the substrates and that the acoustical energy at external surfaces is negligible, thus avoiding a need to place the acoustic wave device 10 in a cavity.

As herein described by way of example, the dielectric layer 24 may comprise silicon oxide or tellurium oxide, wherein the silicon oxide may comprise $SiO_2$ and the tellurium oxide comprises $TeO_2$. Results are herein disclosed below for use of silicon dioxide, by way of example. In addition, a thickness dimension of the dielectric layer 24 ranges between h/2p=25% and h/2p=150%, and further is generally less than h/2p=80%.

With continued reference to FIG. 1, the acoustic wave device 10 is structured such that the piezoelectric substrates 12, 18 and the dielectric layer 24 are generally "acoustically symmetric" along a direction 30 perpendicular to the surfaces 16, 22 of the piezoelectric substrates. Acoustically symmetric herein refers to a structure that has symmetrically balanced layers in that the substrates 12, 18 preferably have similar cuts forming the surfaces having the transducers 14, 20 thereon, the transducers themselves are formed from similar materials and have similar thicknesses, and their electrodes are aligned. Electrical connections do not have to be symmetric. However, the thickness dimensions 32, 36 of the substrates 12, 18, respectively, may be chosen to be large enough to ensure that no acoustic energy is on an outside surface 19 of the acoustic wave device 10, thus the substrate thicknesses 32, 36 may be different for the acoustic wave device 10. The transducers 14, 20 may have their respective electrodes aligned with each other. The thicknesses of the electrodes may be equivalent. The interdigital transducers 14, 20 may be formed from a metal having substantially higher impedance than an impedance of the dielectric layer 24.

As illustrated with continued reference to FIG. 1, the acoustic wave device 10 may thus form an acoustic filter having an acoustic coupling of at least two IDTs 14, 20 of two resonators through at least one coupling material formed by the dielectric layer 24. Acoustic energy propagates from one transducer 14, 20 to the other through the dielectric layer 24. To be able to convert electric energy to acoustic energy, material forming the dielectric layer 24 (a coupling layer as herein described by way of example) or at least one of the two substrates 12, by way of example, should be formed from a piezoelectric material. As herein presented by way of example, the acoustic wave device 10 includes two identical piezoelectric substrates 12, 18 having the dielectric layer 24 between them.

The structure of the acoustic wave device 10, herein described, is an acoustic waveguide. Several modes may be guided in the dielectric layer 24. By way of example, a first symmetric wave mode 38 and a first anti-symmetric wave mode 40 are schematically illustrated with continued reference to FIG. 1. These two wave modes 38, 40 propagate at two different velocities, so that two resonance frequencies are obtained. The filter bandwidth of the acoustic wave device 10 is given by the frequency difference between these two wave modes 38, 40.

As a result of the structure illustrated with continued reference to FIG. 1, it is possible to have a balanced input or output, and a single output or input, respectively. As described above, the filter bandwidth is related to the wave mode frequency spacing and as a result, it is possible to have long transducers and resonators. Power density is reduced and thus linearity and power handling are improved. Further, a cavity package is not necessary since no acoustic wave is propagating on an external surface of the device. In addition, if materials for the substrates 12, 18 and the coupling layer 24 are well chosen, the variation of frequency with temperature can be reduced. The overall size of the acoustic wave device 10 is smaller since the transducers 14, 20 are now on two substrates 12, 18 instead of only one, as is typical in the art. The resistive losses of the acoustic wave device 10, a CFR by way of example, will be reduced since the transducer can have more electrodes and have a smaller aperture. In a case of a balanced drive configuration, the symmetry is desirable.

Figure 2:
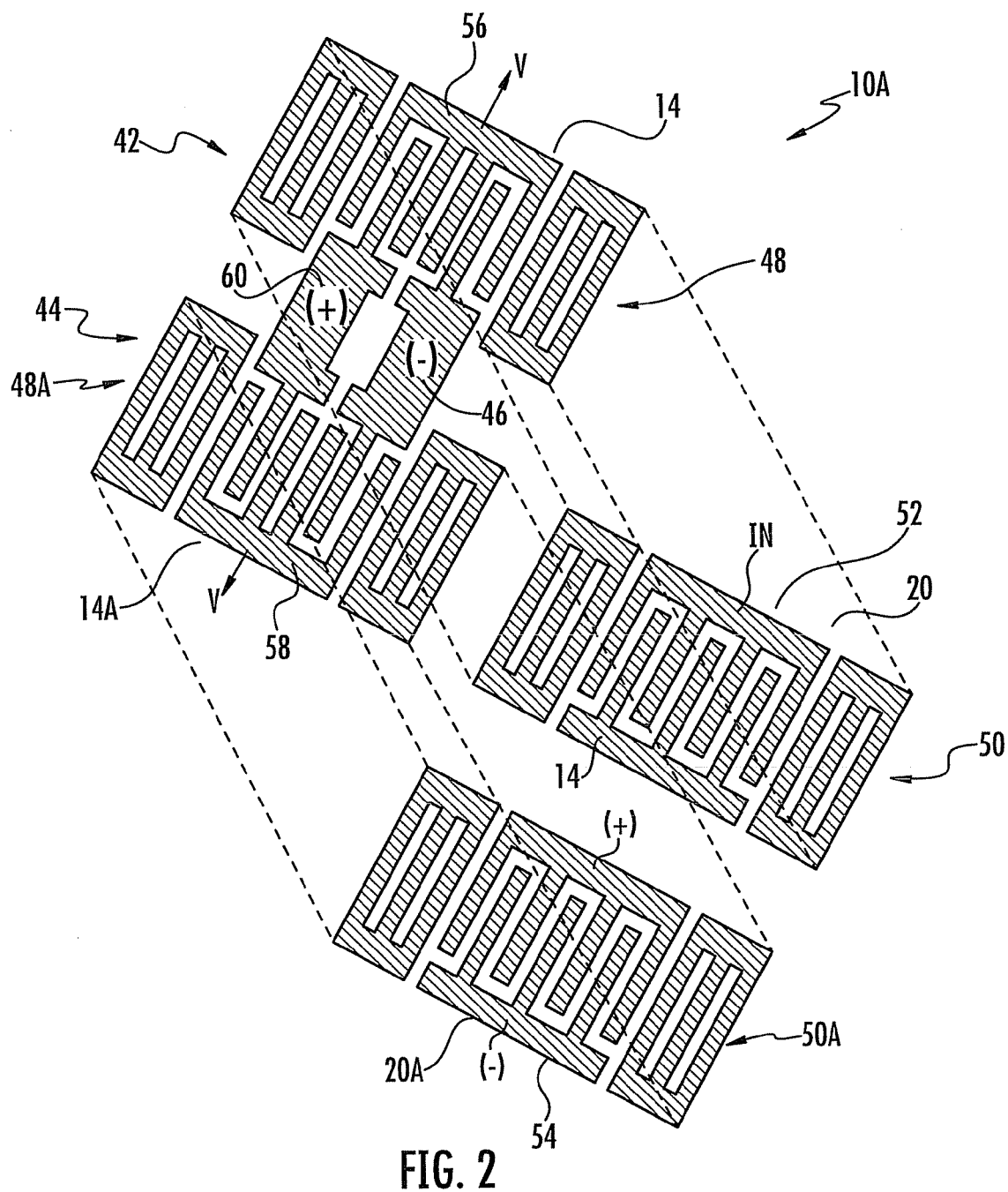
FIG. 2 illustrates an acoustic wave filter device according to another embodiment of the present invention.

FIG. 2 illustrates an acoustic wave filter device according to another embodiment of eth invention. The structure illustrated with reference to FIG. 1 illustrates a basic structure with an understanding that generally all design and manufacturing methods may be used for acoustic wave devices, by way of example as herein described. By way of further example, and with reference to FIG. 2, two or more CRF stages, first stage 42, and second stage 44, are cascaded via an electrical connection 46 to form a filter device 10A. The filter device 10A as herein illustrated includes IDTs 14, 20, 14A, 20A, first and second substrates 12, 18 (not shown for clarity) and the dielectric layer 24, where the substrates 12, 18 are as earlier described with reference to FIG. 1. By way of example, the transducers 14, 20 may be as earlier described with reference to FIG. 1, and the transducers 14A, 20A may be formed as transducers 14 20, except for the differences herein addressed.

Each cascaded CRF stage 42, 44 comprises resonators 48, 50, 48A, 50A, wherein resonators 48, 50 of the first CFR stage are aligned over each other, and the resonators 48A, 50A of the second CFR stage 44 are aligned over each other. An input transducer 52 of the first CFR stage 42 is driven in single mode while an output transducer 54 of the second CFR stage 44 is driven in a balanced mode. The input and outputs are obtained from the lower transducers 20, 20A while the upper transducers 14, 14A are connected via an electrical connection 46 in order to be cascaded. On each of the upper transducers 14, 14A, one of the busbars 56, 58 is connected to a reference potential (V). The upper level and the lower level need electrical connections. This makes the process technology more complex. It is possible to avoid this issue by driving the IDT of the upper level in balanced mode instead of driving it in a single mode. With continued reference to FIG. 2, the transducers 14, 14A, also referred to herein as upper transducers, are split transducers and include split busbars 60. The split transducers have opposite polarities (+/−). The two halves have opposite electrical potentials and thus the common busbars do not have to be electrically connected. Stated again, there is a single input and a balanced output, thus no connection is needed to the upper transducers from the lower transducers. Further, as a result in a phase shift in the upper transducers, the electrical potentials (V) are naturally close to zero, while the electrical potentials on the coupling busbars are opposite.

Figure 3:
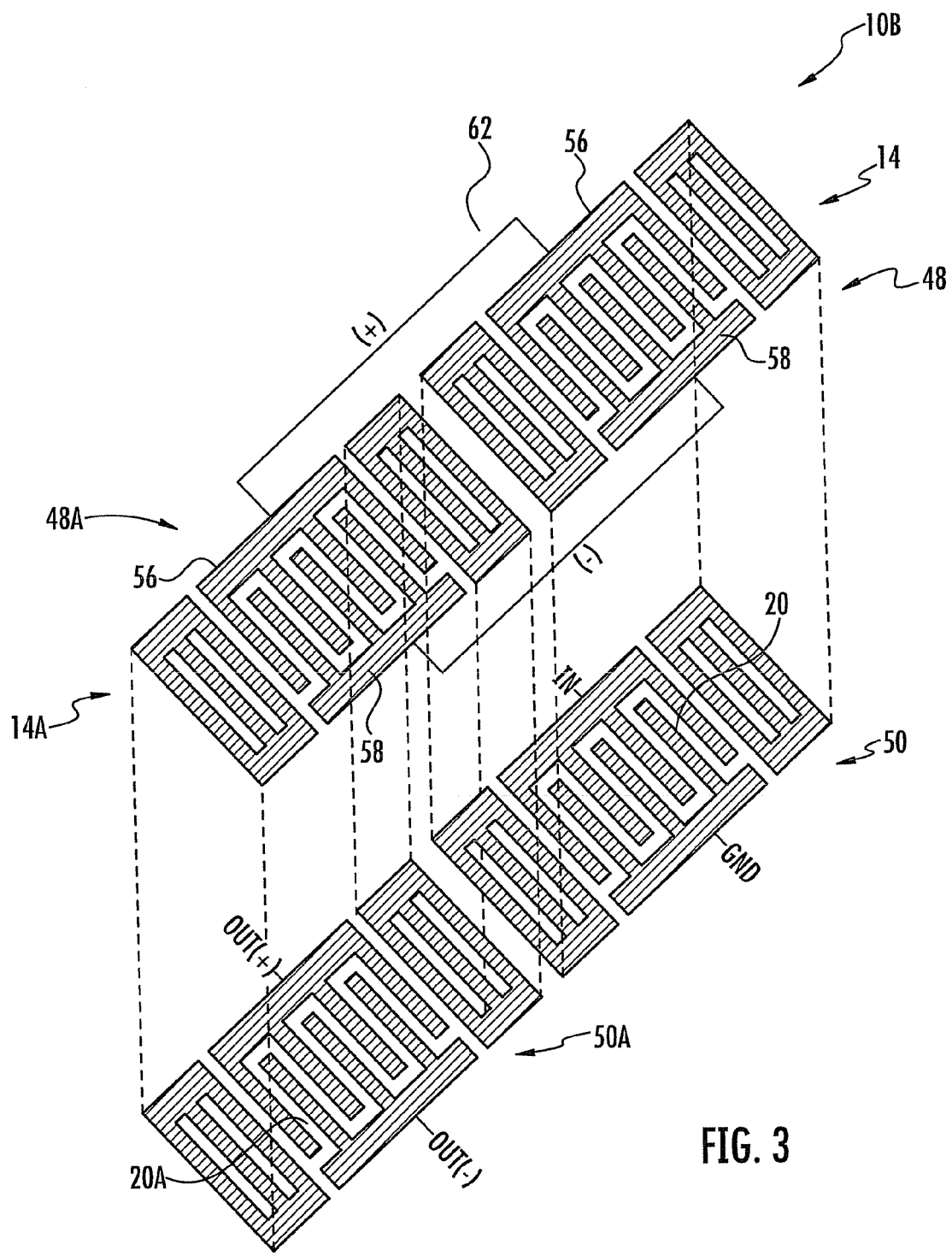
FIG. 3 illustrates yet another embodiment of the present invention.

FIG. 3 illustrates yet another embodiment of the present invention. In FIG. 3, two busbars 56, 58 of the upper transducers 14, 14A are electrically connected via connection 62. Since only the potential difference between busbars 56, 58 is of interest and not the potential value, no external connection on the upper transducers 14, 14A is needed for the filter 10B. As described earlier for the filter device 10A, there is a single input and a balanced output, thus no connection is needed to the upper transducers 14, 14A from the lower transducers 20, 20A.

The examples given above use a single input and balanced output, but it is well understood that these configurations will work for any kind of input and output drive. In addition, basic filter structures are herein presented by way of example, but it will be clear to those of skill in the art, now having the benefit of the teachings of the present invention that all designs and fabrication methods known for SAW CRF are appropriate and will benefit for the teachings. For example, the input or the output transducer can be split to increase filter impedance, and several tracks may be connected in parallel to reduce the impedance. More than two filters may be cascaded and resonators may be connected to improve rejection.

By way of further example, while only filters 10, 10A, 10B are herein presented, such filters may be part of a duplexer. Each transducer in each track may be apodized, withdrawal weighted or a piston mode technique may be used to reduce transverse modes. Each track may comprise more than one transducer. The transducer can use a different sampling than two electrodes per wavelength and unidirectional transducers may be used. In addition, not only filters can be realized using this technology, but any type device typically accessible to SAW technology such as a resonator, sensor or RF ID tag.

Several choices are possible for materials to use in fabrication of the devices. With the material used, there should be sufficient piezoelectric coupling for the upper and lower transducers. Two approaches are herein presented by way of example. In a first approach, the two substrates are made of piezoelectric material and the center layer is made of a dielectric material, as above illustrated with referee to FIG. 1. To reduce the frequency shift with temperature, it is advantageous to have silicon oxide in the center dielectric layer 24. As above described with reference to FIG. 1, it is also advantageous, but not mandatory, to have a symmetric structure, wherein the same substrate 12, 18 is used on both sides of the dielectric layer 24. For wideband applications, lithium niobate or lithium tantalate is used for the substrates 12, 18. With lithium tantalate, an orientation between YXl 30 and YXl 50 has provided desirable results, wherein IEEE conventions are used to describe orientations.

For narrowband applications, quartz or langasite may be used.

Coupling the transducers 14, 20 may include using a piezoelectric coupling material such as a film of aluminum nitride, lithium niobate, or lithium tantalate. This film may be deposited on the surfaces 16, 22. In addition, the coupling between the lower and upper tracks may be adjusted by using multiple central layers 24A, 24B.

Figure 4:
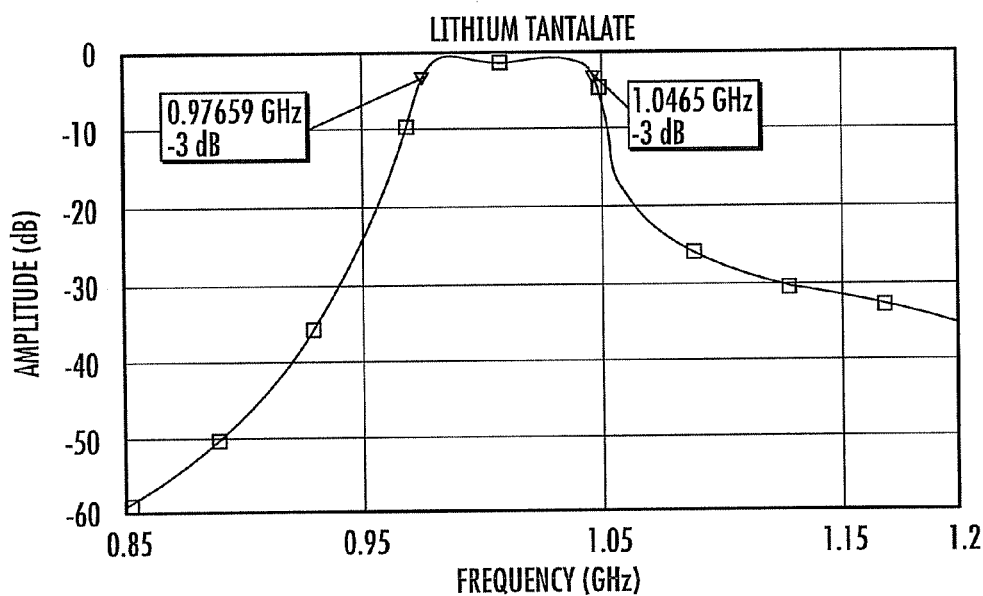
FIG. 4 illustrates a simulated response resulting for a two stage filter as described with reference to FIG. 3, wherein piezoelectric substrates are lithium tantalate YXl46 and a coupling dielectric layer is silicon oxide.
Figure 4A:
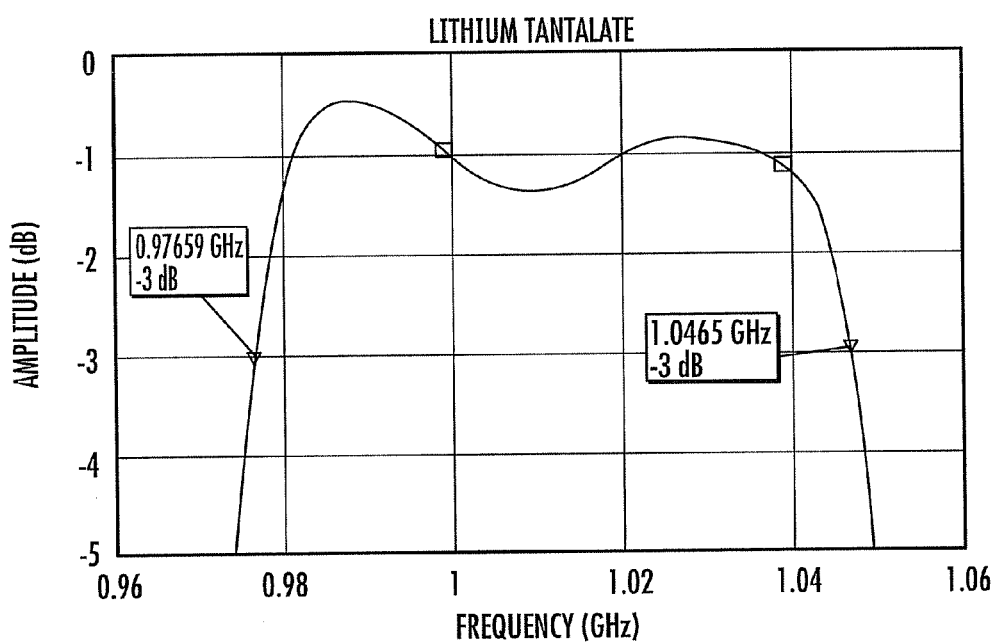
FIG. 4A illustrates a portion of the response in FIG. 3 in an expanded scale.

Simulations were completed using a coupled finite element and boundary element modeling (FEM/BEM) program assuming an infinitely periodic device. FIGS. 4 and 4A illustrate a simulated response resulting for a two stage filter 10B as described with reference to FIG. 3 wherein the external substrates 12, 18 are lithium tantalate YXl 46 and the coupling dielectric layer 24 is silicon oxide. The electrodes of the transducers 14, 20, 14A, 14B are made of copper. The period p of the transducers are 2 μm while the oxide thickness 34 is 2.5 μm (hsio2/2p=62.5%) and the electrode thickness is 0.1 μm (h/2p=2.5%). The relative bandwidth is about 7% while the loss remains low. Shunt inductances are used at the input, the output and to couple the two filter sections.

Figure 5:
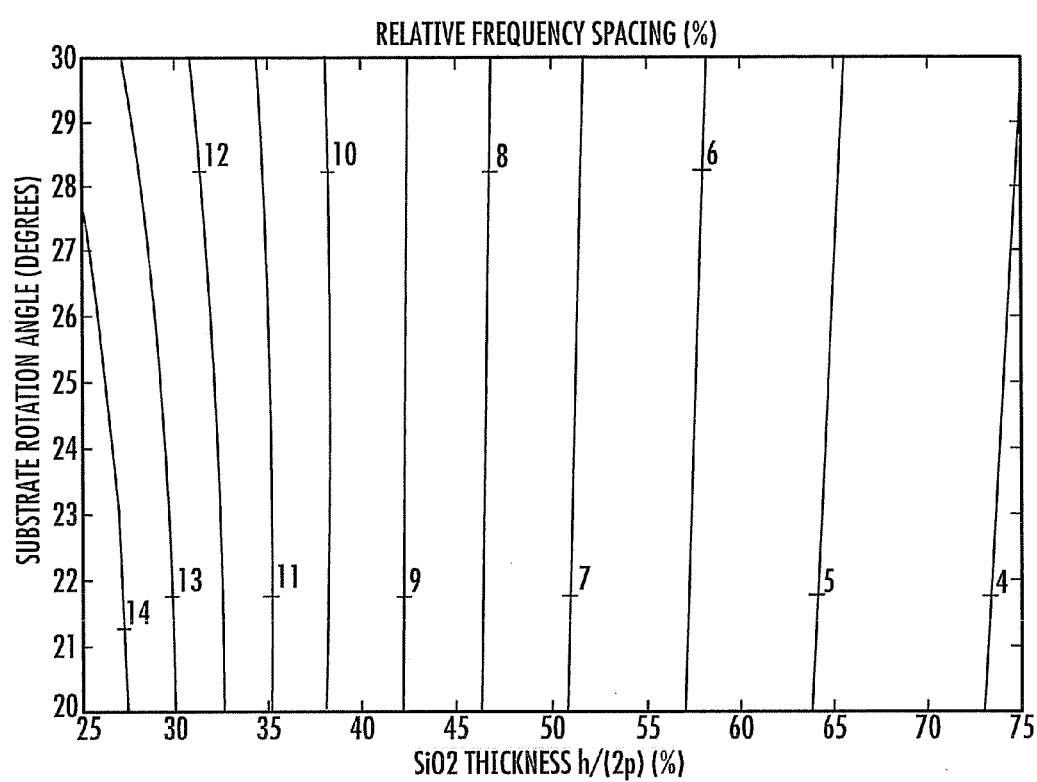
FIG. 5 is a plot illustrating a simulated relative spacing between a symmetric and anti-symmetric modes for lithium niobate substrates and a silicon oxide separation layer.
Figure 6:
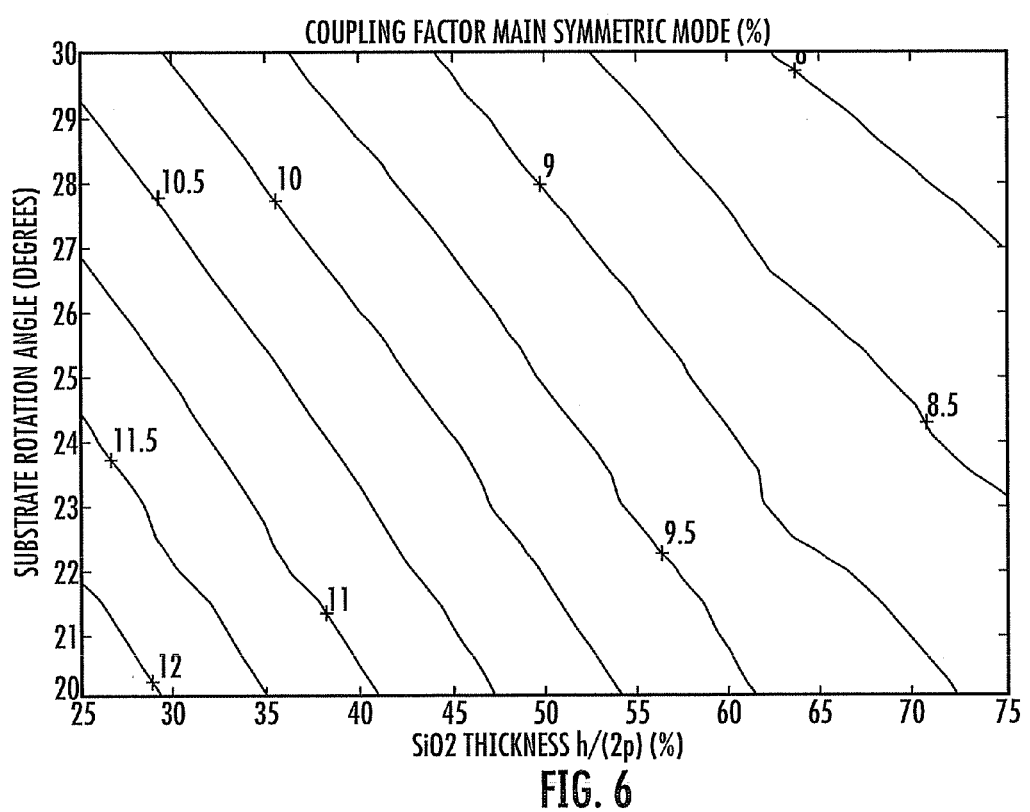
FIG. 6 is a plot illustrating a simulated equivalent piezoelectric coupling for a main symmetric mode for lithium niobate substrates and a silicon oxide separation layer.
Figure 7:
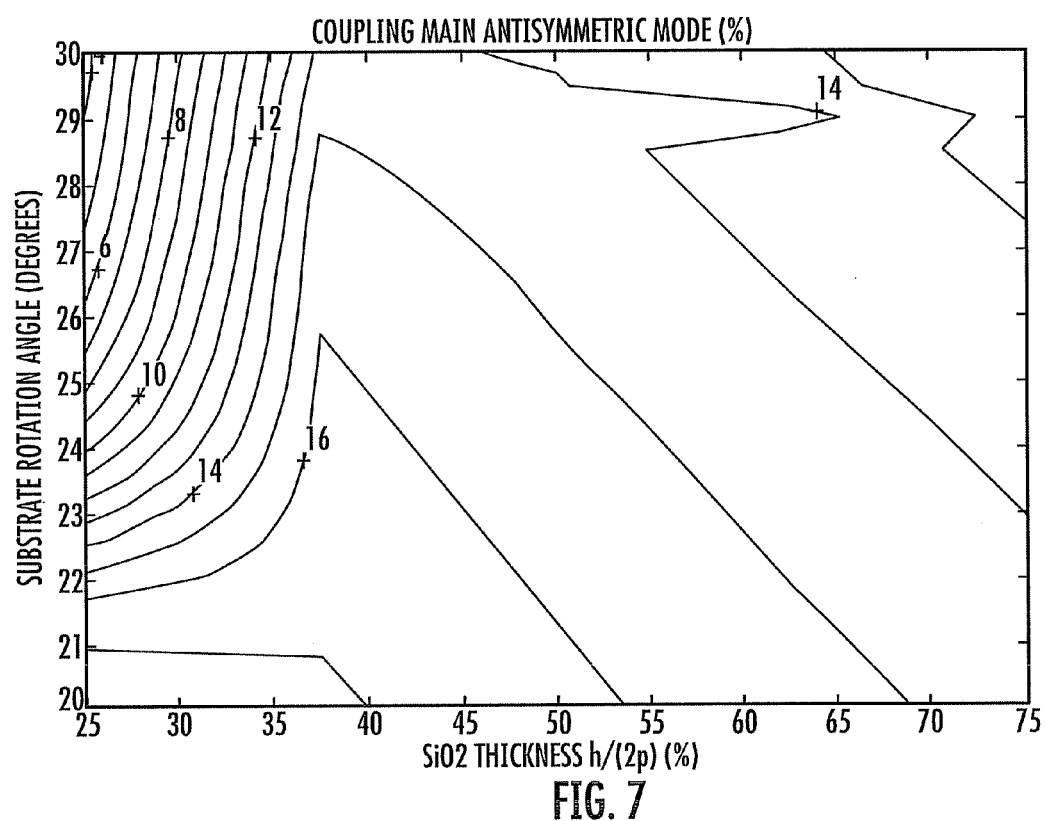
FIG. 7 is a plot illustrating a simulated equivalent piezoelectric coupling for a main anti-symmetric mode for lithium niobate substrates and a silicon oxide separation layer.
Figure 8:
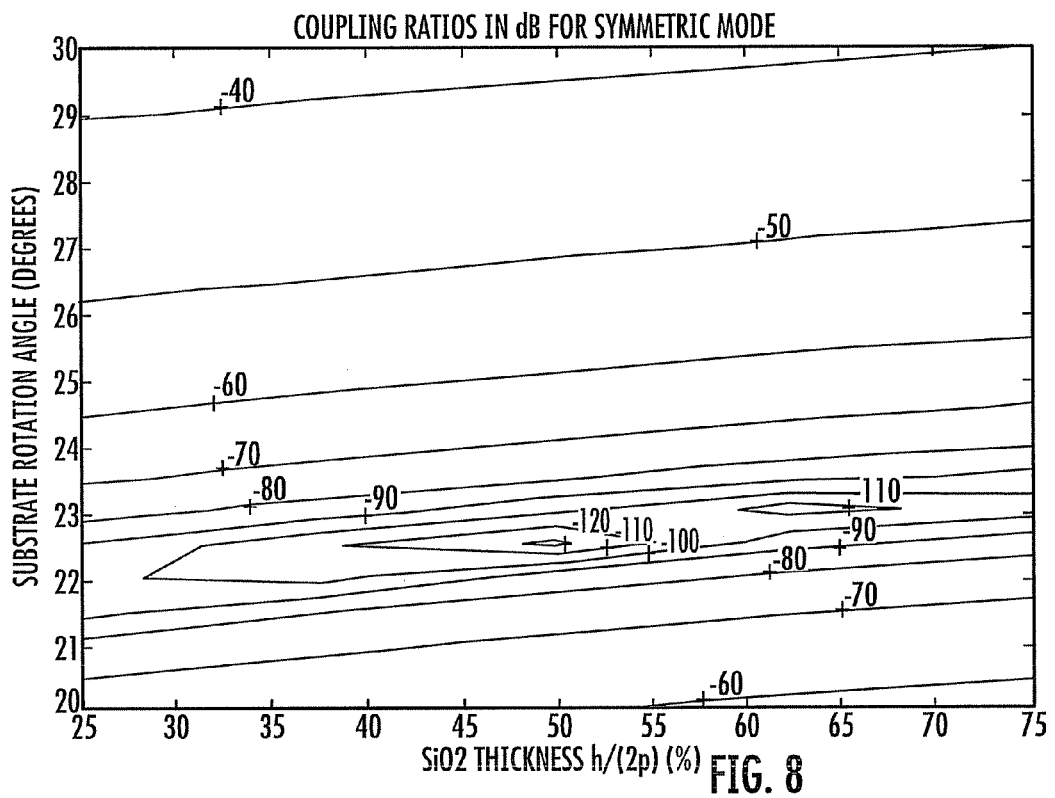
FIG. 8 is a plot illustrating a ratio of the main symmetric mode to a spurious symmetric mode.
Figure 9:
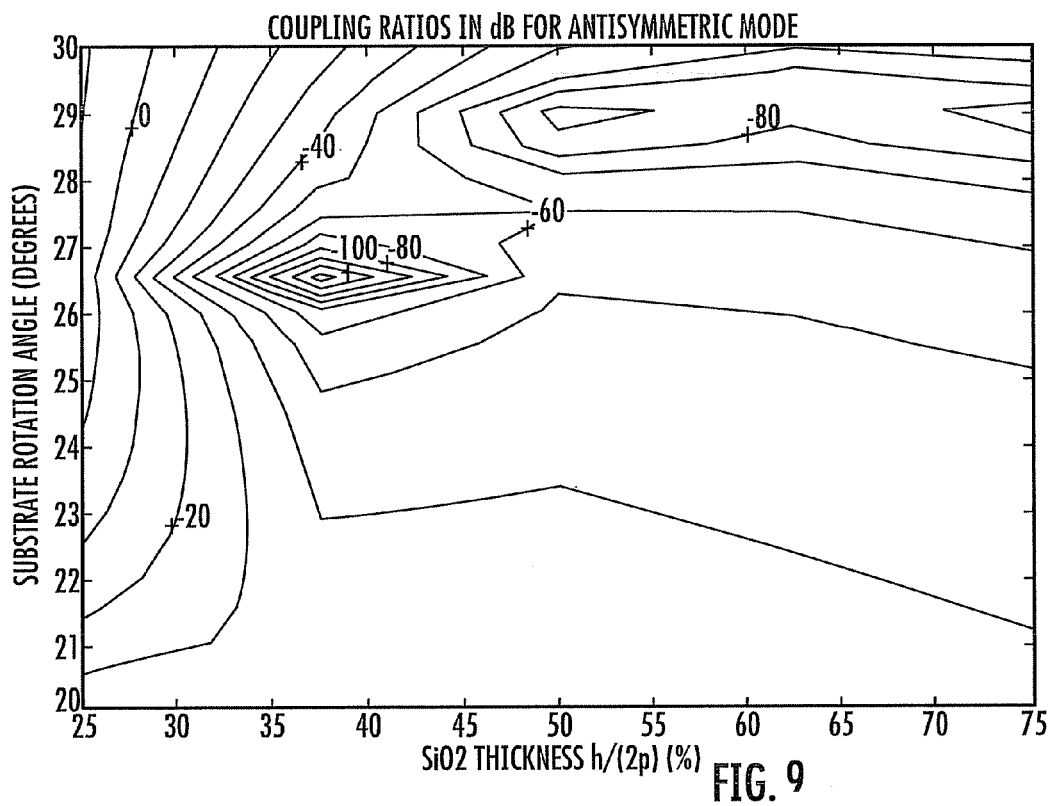
FIG. 9 is a plot illustrating a ratio of the main anti-symmetric mode to a spurious anti-symmetric mode.

In the case of a lithium niobate substrate, one difficulty is the existence of propagation modes of different polarization. Typically, modes having mostly a shear horizontal polarization exist as well as modes having mostly a polarization in the sagittal plane. It is preferable to design the filter to have mostly one polarization. FIG. 5 illustrates a variation relative frequency shift difference between the two modes in function of the rotation angle and the silicon oxide thickness. It can be shown that the main factor influencing the frequency difference is the oxide thickness. The electrodes are made of copper of thickness h/2p=10%. FIGS. 6 and 7 illustrate the variation of the equivalent piezoelectric coefficient for two main modes. High coupling in the 10% range can be obtained. FIGS. 8 and 9 illustrate a ratio of the spurious to the main mode for the symmetric and anti-symmetric modes. It can be seen that the spurious level remain below −50 dB for the symmetric mode when the rotation angle is between 20 and 26 deg. The cut angle for the lowest spurious is optimum between 22 and 23 degrees. For the anti-symmetric mode, the optimum is about 26 degrees.

Figure 10:
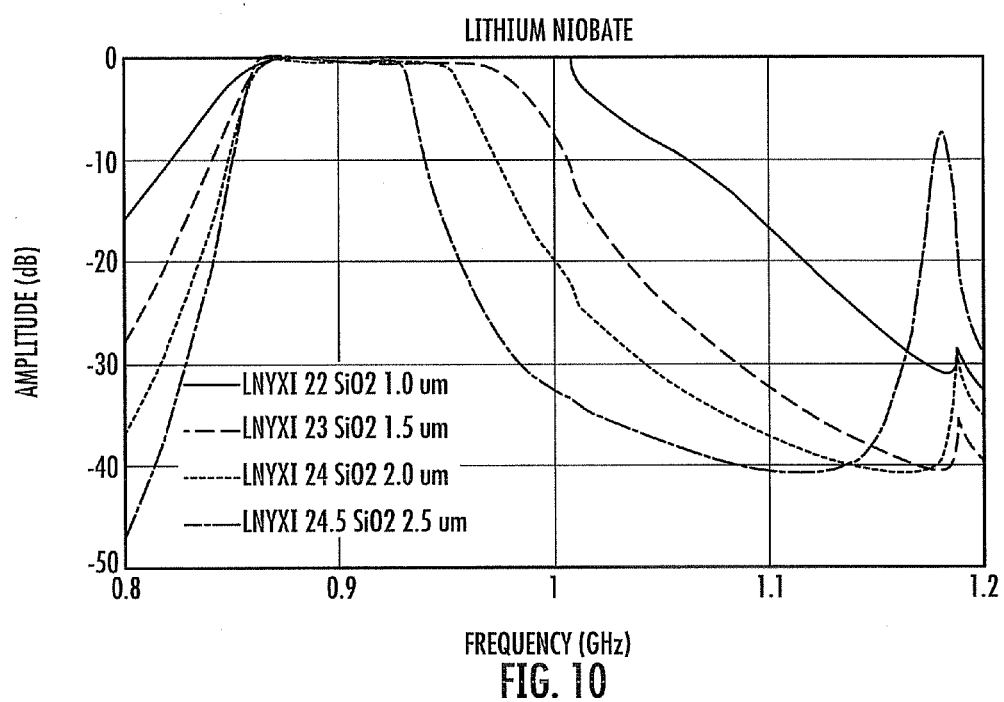
FIG. 10 is a plot illustrating a simulated response for filters employing lithium niobate substrates sandwiching a silicon dioxide layer.

FIG. 10 illustrates simulated responses for several filters cascading two stages on lithium niobate. The period is 2 μm. The electrode thickness is h=0.4 μm while the oxide thickness is varied from 1.0 μm to 2.5 μm. The cut is adjusted to reduce the spurii.

Very low losses are expected and the pass band is varying from 150 MHz to 70 MHz by increasing the thickness of the oxide. The wider filter (SiO2 thickness=1 μm) is simulated assuming a shunt inductance between the stages and at the inputs and outputs. Due to the high piezoelectric coupling a shunt capacitance is added between the stages for all other filters. The narrower filter (SiO2 thickness=2.5 μm) uses shunt capacitance at the input and output. The two other filters (SiO2 thickness=1.5 μm and 2.0 μm) uses inductances at the input and output. Very low impedances (in the 10 ohms ranges) can be obtained with small sizes. As is known, capacitances can be integrated in a device by using an interdigital transducer with a period and direction selected to avoid a presence of acoustic modes in a selected band of the device.

When the silicon oxide thickness increases, a spurious response appears at about 1.17 GHz. This is due to propagation modes in the silicon oxide. It is possible to suppress this response by shifting the periods of the two cascaded stages in order to shift the spurious responses of the cascaded stages. Optionally, adding more layers between the transducers is effective. By way of example, introducing a layer of a dielectric material with a fast velocity material, such as aluminum nitride or silicon nitride in the center layer reduces the bandwidth without needing a large thickness of silicon oxide and so without generating this spurious. In addition, using several layers provides more freedom to compensate for temperature variations.

One difficulty when manufacturing a new device is in the alignment of the transducers. A wafer bonding process may be used to achieve the desired alignment. One method includes making the transducers on separate wafers and using a direct wafer bonding. One challenge in manufacturing the devices 10, 10A, 10B is obtaining a desired alignment of the two wafers carrying the transducers. Accuracy on wafer bonders is currently around 1 μm. Alignment accuracy has been measured at 0.15 μm and 200 nm, which is acceptable for 1 GHz devices. Based on current efforts in 3D integration technology, it is anticipated that the alignment accuracy obtained by commercial wafer bonders will continue to be improved.

Another solution is to make the two transducers on one wafer and then to bond another wafer on top. The difficulty is then that the bonding has to be done both on the metal and oxide or a thin layer has to be placed between above the metal. Then, the permittivity of this material has to be as high as possible to avoid reducing the coupling coefficient. Further to the development of devices herein described, bonding a piezoelectric wafer on a processed wafer containing both oxide and metal has been accomplished.

With regard to electrical contacts, various manufacturing methods are possible. The first is a bonding of a die on a wafer. The second is as described in patent publication WO03088475 (A1), wherein an oblique saw is used to cut one wafer and part of a second one to obtain access to contacts at wafer level.

One way to make the devices herein described includes a deposition process to deposit a piezoelectric film on top of one transducer and to add a transducer on top of the film. The coupling material is now the piezoelectric film.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An acoustic wave device comprising:
a first piezoelectric substrate having a first interdigital transducer on a surface of the first substrate;
a second piezoelectric substrate having a second interdigital transducer on a surface of the second substrate; and
a dielectric layer interposed between the first and second piezoelectric substrates, wherein the first and second interdigital transducers are positioned at an interface between the respective first and second piezoelectric substrates and the dielectric layer, and wherein the first and second interdigital transducers are electrically isolated yet acoustically coupled to each other.

2. The device according to claim 1, wherein the dielectric layer comprises multiple layers.

3. The device according to claim 2, further comprising a metal layer among the multiple layers.

4. The device according to claim 1, wherein the piezoelectric substrates and the interdigital transducers are generally acoustically symmetric along a direction perpendicular to the surfaces of the piezoelectric substrates, and wherein the thickness dimensions thereof are equivalent.

5. The device according to claim 4, wherein the first and second piezoelectric substrates have similar cuts forming the surfaces having the first and second interdigital transducers thereon, wherein the first and second interdigital transducers are formed from similar materials and have similar thicknesses, and wherein electrodes forming the first interdigital transducer are aligned with electrodes forming the second interdigital transducer.

6. The device according to claim 1, wherein the interdigital transducers are formed from a metal having substantially higher impedance than an impedance of the dielectric layer.

7. The device according to claim 1, wherein the dielectric layer comprises at least one of silicon oxide and tellurium oxide.

8. The device according to claim 7, wherein the silicon oxide comprises $SiO_2$ and the tellurium oxide comprises $TeO_2$.

9. The device according to claim 1, wherein a thickness dimension h of the dielectric layer ranges between h/2p=25% and h/2p=150%, wherein p is an electrode finger period of the first and second interdigital transducers.

10. The device according to claim 9, wherein the thickness dimension of the dielectric layer is generally less than h/2p=80%.

11. The device according to claim 1, wherein the dielectric layer is formed from a material supporting an acoustic wave, and wherein a velocity of the acoustic wave in the material increases with an increased temperature of the material.

12. The device according to claim 1, wherein electrodes forming the interdigital transducer have an average density larger than a density of aluminum.

13. The device according to claim 12, wherein the electrodes comprise at least one of copper, tungsten, molybdenum gold and platinum.

14. The device according to claim 1, wherein the piezoelectric substrates comprise at least one of lithium niobate and lithium tantalate.

15. The device according to claim 14, wherein an orientation of the lithium niobate substrate ranges between YX and YXl 30.

16. The device according to claim 15, wherein electrodes forming the interdigital transducers primarily comprise copper, and wherein a thickness h of the electrodes ranges between h/2p=5% and h/2p=15%, wherein p is an electrode finger period of the first and second interdigital transducers.

17. The device according to claim 16, wherein the piezoelectric substrates comprise lithium tantalate.

18. The device according to claim 17, wherein each of the substrates comprise an orientation between YXI 30 and YXI 50.

19. The device according to claim 14, wherein electrodes forming the interdigital transducer comprise primarily copper and each have a thickness h ranging between $h/2p=1\%$ and $h/2p=4\%$, wherein p is an electrode finger period of the first and second interdigital transducers.

20. The device according to claim 1, wherein an acoustical displacement of waves propagating within the device is primarily in a direction parallel to electrodes forming the interdigital transducers.

21. The device according to claim 1, wherein the interdigital transducers comprise at least two cascaded filter tracks.

22. The device according to claim 21, the cascaded orientation between the two filter tracks includes a differential connection.

23. The device according to claim 1, wherein an acoustical wave is guided in the dielectric layer.

24. The device according to claim 23, wherein the wave comprises at least two acoustical modes excited in the dielectric layer.

25. The device according to claim 24, wherein one of the acoustical modes is symmetric and the other anti-symmetric.

26. The device according to claim 1, wherein a velocity of an acoustical wave propagating in a direction perpendicular to electrodes forming the interdigital transducers is larger in the piezoelectric substrates than in the dielectric layer.

27. The device according to claim 1, wherein a product of a center frequency of an acoustic wave being propagated by twice an electrode period for electrodes forming the interdigital transducers is lower than bulk acoustic velocities in the substrates for a direction of an acoustic wave propagating perpendicular to the electrodes.

28. An acoustic wave device comprising:
  a plurality of coupled resonator filter stages, wherein each stage includes:
    a first piezoelectric substrate having a first interdigital transducer on a surface thereof;
    a second piezoelectric substrate having a second interdigital transducer on a surface thereof; and
    a dielectric layer interposed between the first and second piezoelectric substrates, wherein the first and second interdigital transducers are electrically isolated yet acoustically coupled to each other; and
  an electrical connection between the first interdigital transducers within each of the plurality of coupled resonator filter stages sufficient for providing a cascading thereof.

29. The device according to claim 28, further comprising:
  an input at one of the second interdigital transducers within one of the plurality of coupled resonator filter stages; and
  an output at one of the second interdigital transducers within another of the plurality of coupled resonator filter stages.

30. The device according to claim 28, wherein electrodes forming the first interdigital transducer are aligned over electrodes forming the second interdigital transducer within each of the plurality of coupled resonator filter stages.

31. The device according to claim 29, wherein the input transducer of the one stage is driven in single mode and the output transducer of the other stage is driven in a balanced mode.

32. The device according to claim 28, wherein each of the first interdigital transducers comprises a busbar connected to a reference potential voltage.

33. The device according to claim 28, wherein the first interdigital transducers are driven in a balanced mode.

34. The device according to claim 28, wherein the electrical connection for the first interdigital transducers comprises the first interdigital transducer formed as a split transducer, and wherein the split transducers within adjoining stages are connected.

35. The device according to claim 34, wherein the split transducers include busbars comprising opposite polarities on each split portion thereof.

36. The device according to claim 28, wherein the plurality of coupled resonator filter stages comprises two stages.

37. The device according to claim 28, wherein the dielectric layer is a common layer for each of the plurality of coupled resonator filter stages.

* * * * *